(12) United States Patent
Takahashi et al.

(10) Patent No.: US 8,587,244 B2
(45) Date of Patent: Nov. 19, 2013

(54) METHOD AND SYSTEM FOR DETERMINING DETERIORATION OF PERMANENT MAGNETS OF ELECTRIC APPARATUS

(75) Inventors: Akihiko Takahashi, Nagano (JP); Yasushi Misawa, Nagano (JP); Manabu Horiuchi, Nagano (JP)

(73) Assignee: Sanyo Denki Co., Ltd., Tokyo (JP)

(*) Notice: Subject to any disclaimer, the term of this patent is extended or adjusted under 35 U.S.C. 154(b) by 271 days.

(21) Appl. No.: 13/240,134

(22) Filed: Sep. 22, 2011

(65) Prior Publication Data
US 2012/0068653 A1 Mar. 22, 2012

(30) Foreign Application Priority Data
Sep. 22, 2010 (JP) ................... 2010-212407

(51) Int. Cl.
*H02P 21/14* (2006.01)
(52) U.S. Cl.
USPC ............ 318/490; 318/400.02; 318/558
(58) Field of Classification Search
USPC ........ 318/400.02, 400.34, 400.38, 490, 558, 318/647, 653
See application file for complete search history.

(56) References Cited

U.S. PATENT DOCUMENTS

| | | | | |
|---|---|---|---|---|
| 6,720,792 | B2 * | 4/2004 | Raftari et al. | 324/765.01 |
| 6,822,418 | B2 * | 11/2004 | Harke | 318/807 |
| 7,005,828 | B2 * | 2/2006 | Karikomi | 318/801 |
| 7,531,982 | B2 * | 5/2009 | Okamura et al. | 318/701 |
| 2011/0260748 | A1 * | 10/2011 | Lee et al. | 324/765.01 |

FOREIGN PATENT DOCUMENTS

| | | |
|---|---|---|
| JP | 09-172703 | 6/1997 |
| JP | 2009-022091 | 1/2009 |
| JP | 2009-072023 | 4/2009 |

* cited by examiner

*Primary Examiner* — Bentsu Ro
(74) *Attorney, Agent, or Firm* — Rankin, Hill & Clark LLP

(57) ABSTRACT

A method and a system for determining deterioration of permanent magnets of an electric apparatus to be inspected to facilitate determination without the need to remove the electric apparatus from a facility where it is installed. If the electric apparatus to be inspected is a three-phase linear motor, a current detector is used to acquire currents. A three-phase/two-phase conversion section converts the acquired currents into an $\alpha$-axis current command and a $\beta$-axis current command. A locus of a current vector is computed based on the $\alpha$-axis current command and the $\beta$-axis current command. A comparing and determining section compares the computed locus with a standard upper limit value stored in a storage means. If the number of times that the locus of the current vector exceeds the standard upper limit value exceeds a predetermined value, it is determined that the permanent magnets have been deteriorated.

20 Claims, 9 Drawing Sheets

US 8,587,244 B2

METHOD AND SYSTEM FOR DETERMINING DETERIORATION OF PERMANENT MAGNETS OF ELECTRIC APPARATUS

BACKGROUND OF THE INVENTION

1. Technical Field

The present invention relates to a method and a system for determining deterioration of permanent magnets of an electric apparatus including a mover, a stator, a plurality of permanent magnets provided at one of the mover and the stator, and an armature winding provided at the other of the mover and the stator.

2. Related Art

An electric apparatus such as an electric motor may become unable to exhibit its original performance if permanent magnets provided at a mover or a stator are broken, chipped, demagnetized, or anyway deteriorated. If the permanent magnets are broken or chipped, scattered fragments of the permanent magnets may damage components of the electric apparatus. Conventionally, it is determined whether or not the permanent magnets are deteriorated by dismantling the electric apparatus for a visual inspection, or based on how much induced voltage is reduced as described in Japanese Patent Application Publication No. 2009-22091 (JP2009-22091A).

In order to examine deterioration of the permanent magnets through a visual inspection, however, it is required to stop an operation of the electric apparatus to be inspected, and to dismantle the electric apparatus after removal from a facility where it is installed. In addition, it is difficult to quantitatively collect inspection data because the visual inspection is performed with human eyes. If only the induced voltage is examined as in the technique disclosed in JP2009-22091A, local demagnetization, breakage, and chipping of the permanent magnets may not be reliably detected.

SUMMARY OF THE INVENTION

An object of the present invention is to provide a method and a system for determining deterioration of permanent magnets of an electric apparatus to be inspected that facilitate determination without the need to remove the electric apparatus from a facility where it is installed.

A method of determining deterioration of permanent magnets according to the present invention determines deterioration of a plurality of permanent magnets of an electric apparatus to be inspected. The electric apparatus to be inspected includes a mover, a stator, a plurality of permanent magnets provided at one of the mover and the stator, and an armature winding provided at the other of the mover and the stator. The electric apparatus may be of any type as long as it includes a plurality of permanent magnets at one of the mover and the stator and an armature winding at the other of the mover and the stator. Examples of the electric apparatus include an n-phase electric motor or generator (n is an integer of 1 or more), a linear motor, and a DC motor. The method according to the present invention includes: computing a locus of a current vector of an armature current that flows through the armature winding; and determining a state of deterioration of the permanent magnets based on changes in the locus of the current vector.

The term "current vector" as used herein means, for a single-phase electric apparatus, a current vector of an armature current for the single phase itself. For a multiphase or polyphase electric apparatus, the term means a vector sum of current vectors of armature currents for the multiple phases. The "locus" of a current vector refers to a locus which is drawn by the current vector and can be depicted on a graph with two orthogonal axes.

The present invention is based on the findings, as obtained from studies made by the inventors, that deterioration of the permanent magnets causes changes in the locus of the current vector corresponding to the deterioration. The studies made by the inventors have revealed that demagnetization of the permanent magnets makes the locus of the current vector larger compared with when the permanent magnets are not deteriorated. The studies have also revealed that deterioration of the permanent magnets partially swells the locus of the current vector, expands the locus of the current vector outward, or partially increases the radius of the locus of the current vector. In the present invention, based on such findings, it is determined whether or not the permanent magnets are deteriorated based on changes in the locus of the current vector.

Specifically, the method of determining deterioration of permanent magnets includes: providing a normal electric apparatus including a mover, a stator, a plurality of undeteriorated permanent magnets provided at one of the mover and the stator, and an armature winding provided at the other of the mover and the stator; and computing a locus of a current vector of an armature current that flows through the armature winding of the normal electric apparatus to define a standard upper limit value based on a width of changes in the locus for the normal electric apparatus. The current vector of the armature current for the normal electric apparatus has a substantially constant magnitude, and changes only in direction. The locus of such a current vector has an annular, substantially circular shape. Specifically, the mover of the normal electric apparatus is moved a plurality of cycles with respect to the stator to measure the locus of the current vector of the armature current a plurality of times for each of the permanent magnets, and the standard upper limit value is defined based on the width of changes in the radius of the measured locus of the current vector, for example. Alternatively, for example, the locus of the current vector of the armature current may be obtained by flowing a rated current to the armature winding of the normal electric apparatus under a rated load to define the standard upper limit value based on the width of changes in the computed locus. The standard upper limit value may be a value that is equal to or more than an average value of the change width multiplied by 0.9 and that is equal to or less than the average value multiplied by 1.1, for example. Providing a margin for the standard upper limit value makes it possible to determine as desired whether to strictly determine deterioration of the permanent magnets or to allow an error for each electric apparatus.

Besides, the locus of the current vector obtained by flowing the rated current to the normal electric apparatus under the rated load may be computed (through simulation) to define the standard upper limit value based on the computed locus. Also in this case, the standard upper limit value may be a value that is equal to or less than the computed locus of the current vector multiplied by 1.1, for example. For motors, for example, the allowable current value is often determined within a range of ±10% of the rated current so that the standard coil temperature rise value, which is determined to prevent burnout of the armature windings, will not be exceeded. Thus, the standard upper limit value may be defined to be within +10% of the current vector obtained by flowing the rated current in consideration of such an allowable current range.

As described above, the method includes computing a locus of a current vector of an armature current that flows through the armature winding of the electric apparatus to be inspected. If the permanent magnets have not been deteriorated, the locus of the current vector of the armature current for the electric apparatus to be inspected has substantially the same value as the locus of the current vector of the armature current for the normal electric apparatus. If the permanent magnets have been deteriorated, however, the armature current is increased to supplement the shortage of the magnetic flux of the permanent magnets. Therefore, only the locus of a current vector for a deteriorated portion of the permanent magnets exceeds the standard upper limit value. The method may thus include determining that at least part of the permanent magnets of the electric apparatus to be inspected has been deteriorated if the locus of the current vector of the electric apparatus to be inspected exceeds the standard upper limit value. If the standard upper limit value is defined based on the locus of the current vector obtained by flowing the rated current to the normal electric apparatus under the rated load, it is necessary to replace the load on the electric apparatus to be inspected with the rated load and to flow the rated current to the electric apparatus to be inspected in order to place the electric apparatus to be inspected under the same measurement conditions as those of the electric apparatus for comparison.

In this way, the method facilitates determination of deterioration of the permanent magnets without the need to remove the electric apparatus from a facility where it is installed or the need for information on the armature current with respect to time (or position).

The method may further include: defining a standard lower limit value based on the width of changes in the locus for the normal electric apparatus, and determining a difference between the standard upper limit value and the standard lower limit value as a standard change width; and computing a difference between a maximum value and a minimum value of the locus of the current vector of the electric apparatus to be inspected, and determining that all of the plurality of permanent magnets of the electric apparatus to be inspected have been demagnetized if the difference between the maximum value and the minimum value of the locus does not exceed the standard change width. The standard lower limit value may be defined in the same way as the standard upper limit value. That is, the mover of the normal electric apparatus is moved a plurality of cycles with respect to the stator to measure the locus of the current vector of the armature current a plurality of times for each of the permanent magnets, and the standard lower limit value is defined based on the width of changes in the radius of the measured locus of the current vector, for example. The standard lower limit value may be a value that is equal to or more than an average value of the change width multiplied by 0.9 and that is equal to or less than the average value multiplied by 1.1. The demagnetization of the plurality of permanent magnets does not immediately affect an operation of the electric apparatus. However, allowing determination of such demagnetization is advantageous because it helps determine when to repair or replace the electric apparatus.

If the standard upper limit value is defined based on the locus of the current vector obtained by flowing the rated current to the armature winding of the normal electric apparatus under the rated load, the method may further include: defining a standard lower limit value based on the locus for the normal electric apparatus, and defining a difference between the standard upper limit value and the standard lower limit value as a standard change width. In this case, the standard lower limit value may be a value that is equal to or more than the rated current value multiplied by 0.9, for example. This is because values within this range allow the electric apparatus to exhibit its performance.

Specifically, the deterioration may visually be determined. For example, the method may further include: displaying an annular image corresponding to the standard upper limit value and the standard lower limit value on a display screen; and displaying the locus of the current vector of the armature current that flows through the armature winding of the electric apparatus to be inspected on the display screen to superimpose the locus on the annular image. This allows visual determination with human eyes whether or not the locus of the current vector of the electric apparatus to be inspected exceeds the standard upper limit value. This also allows visual confirmation with human eyes of the standard change width (that is, the difference between the standard upper limit value and the standard lower limit value), thereby allowing determination whether or not all of the plurality of permanent magnets have been demagnetized. Consequently, an operator can easily determine the state of deterioration of the permanent magnets on the site where the electric apparatus is installed.

The present invention can also be implemented as a deterioration determining system for permanent magnets. In this case, the deterioration determining system for permanent magnets may include: a current detecting section configured to detect an armature current that flows through the armature winding; a current vector computing section configured to compute a locus of a current vector based on the armature current; and a deterioration state determining section configured to determine the state of deterioration of the permanent magnets based on changes in the locus of the current vector. This configuration facilitates determination as to whether or not the permanent magnets have been deteriorated. An indication of deterioration of the permanent magnets maybe made as desired. For example, a warning may be output to inform a user of the deterioration of the permanent magnets to prompt the user to replace the deteriorated permanent magnets of the electric apparatus, or a stop signal may be output to the electric apparatus to be inspected to stop an operation of the electric apparatus.

The deterioration state determining section may include, for example: a storage means for storing a standard upper limit value defined for a normal electric apparatus; and a comparing and determining section configured to compare the locus of the current vector of the electric apparatus to be inspected and the standard upper limit value and determine whether or not at least part of the plurality of permanent magnets of the electric apparatus to be inspected has been deteriorated based on the number of times that the locus of the current vector of the electric apparatus to be inspected exceeds the standard upper limit value. As a matter of course, the storage means of the deterioration state determining section may further store as a standard change width a difference between a standard lower limit value and the standard upper limit value, and the comparing and determining section may determine that all of the plurality of permanent magnets of the electric apparatus to be inspected have been demagnetized if a difference between a maximum value and a minimum value of the locus of the current vector of the electric apparatus to be inspected does not exceed the standard change width.

If the permanent magnets have been deteriorated, the armature current for the deteriorated portion is increased with a high reproducibility. Therefore, moving the mover n cycles with respect to the stator to measure the locus of the current vector n times for each of the permanent magnets should result in the locus of the current vector exceeding the standard upper limit value n or more times. In order to improve the measurement accuracy by eliminating the effect of noise or the like, the current vector computing section may be configured to compute one annular locus of the current vector for each of the permanent magnets. The current vector computing section may compute the current vector n times for all of the plurality of permanent magnets, the n being a natural number. The comparing and determining section may determine that the deterioration has occurred if the locus of each of the n current vectors for all of the plurality of permanent magnets exceeds the standard upper limit value n times or more. With this configuration, even if the standard upper limit value is exceeded because of noise or the like, for example, it is possible to prevent erroneous determination.

The deterioration determining system for permanent magnets according to the present invention may be incorporated in an electric apparatus. This makes it possible to determine deterioration at any time. As a matter of course, the deterioration determining system for permanent magnets may be attached to an electric apparatus only when it is necessary to determine deterioration.

DESCRIPTION OF THE PREFERRED EMBODIMENTS

Figure 1:
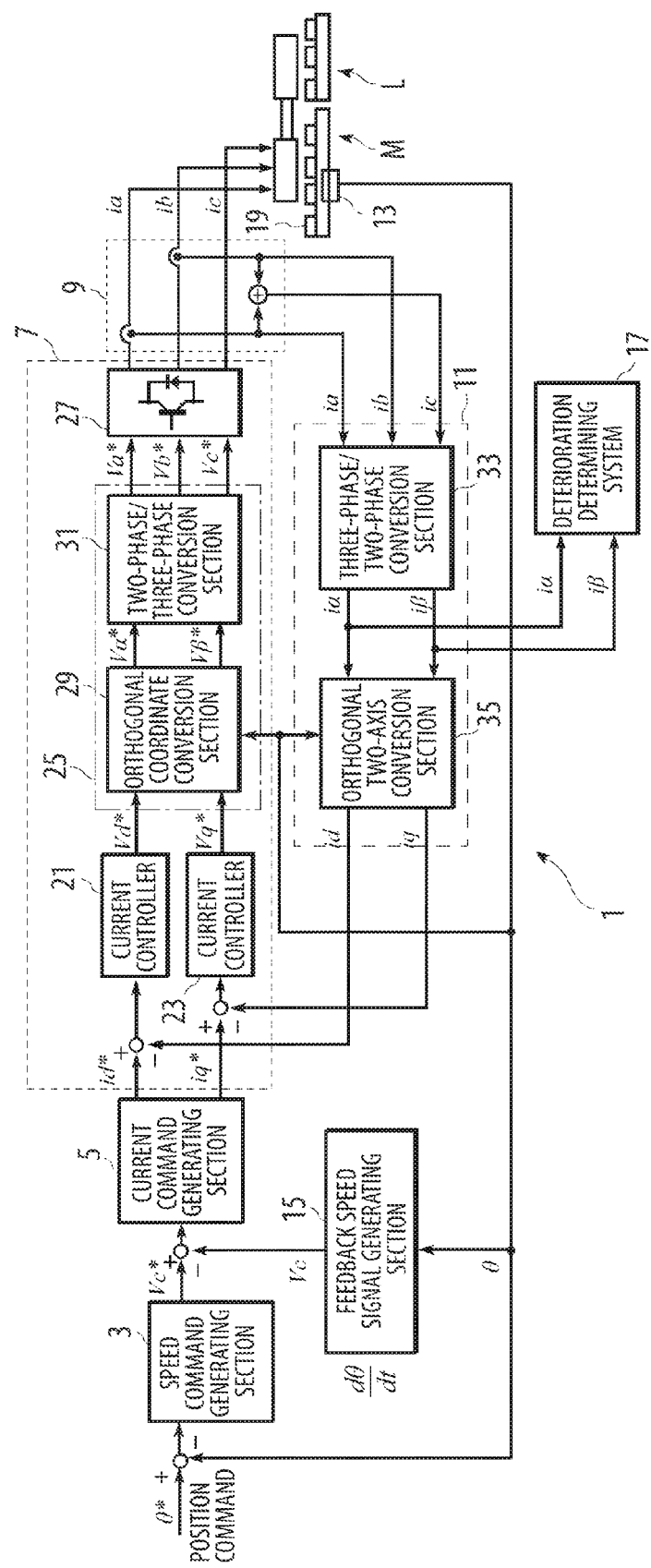
FIG. 1 is a system configuration diagram showing the configuration of a control device for a three-phase linear motor including a deterioration determining system for permanent magnets according to a first embodiment of the present invention.

A deterioration determining system that performs a method of determining deterioration of permanent magnets according to an embodiment of the present invention will be described in detail below with reference to the drawings. FIG. 1 is a system configuration diagram showing the configuration of a control device for a three-phase linear motor including a deterioration determining system for permanent magnets according to a first embodiment of the present invention. The control device 1 includes a speed command generating section 3, a current command generating section 5, an armature current supplying device 7, a current detector 9, a coordinate converter 11, a position detector 13, a feedback speed signal generating section 15, and a deterioration determining system 17. A three-phase linear motor M includes a mover, a stator, a plurality of permanent magnets 19 provided at the stator, and armature windings provided at the mover.

The speed command generating section 3 generates a speed command $V_{c*}$ based on a position command $\theta*$ and a detected position signal $\theta$ output from the position detector 13. The current command generating section 5 outputs a d-axis current command $i_{d*}$ and a q-axis current command $i_{q*}$ based on the speed command $V_{c*}$. The armature current supplying device 7 supplies armature currents to the armature windings of the three-phase linear motor M based on the d-axis current command $i_{d*}$ and the q-axis current command $i_{q*}$ and a d-axis current feedback signal $i_d$ and a q-axis current feedback signal $i_q$. The d-axis current feedback signal $i_d$ and the q-axis current feedback signal $i_q$ will be discussed later. The armature current supplying device 7 includes two current controllers 21 and 23, a coordinate converter 25, and a PWM inverter 27. The current controller 21 converts the difference between the d-axis current command $i_{d*}$ and the d-axis current feedback signal $i_d$ into a d-axis voltage command $V_{d*}$. The current controller 23 converts the difference between the q-axis current command $i_{q*}$ and the q-axis current feedback signal $i_q$ into a q-axis voltage command $V_{q*}$. The coordinate converter 25 includes an orthogonal coordinate conversion section 29 and a two-phase/three-phase conversion section 31. The orthogonal coordinate conversion section 29 performs an orthogonal coordinate conversion on the d-axis voltage command $V_{d*}$ and the q-axis voltage command $V_{q*}$ into an $\alpha$-axis voltage command $V_{\alpha*}$ and a $\beta$-axis voltage command $V_{\beta*}$ based on a signal corresponding to the mover position ($\theta$) from the position detector 13. The two-phase/three-phase conversion section 31 performs a two-phase/three-phase conversion on the $\alpha$-axis voltage command $V_{\alpha*}$ and the $\beta$-axis voltage command $V_{\beta*}$ into three-phase voltage commands $V_{a*}$, $V_{b*}$, and $V_{c*}$. The PWM inverter 27 converts DC power into three-phase AC power through PWM control of an inverter based on the PWM control commands $V_{a*}$, $V_{b*}$, and $V_{c*}$ to supply the resulting three-phase armature currents to the three-phase linear motor M. The armature current supplying device 7 determines the phase of the armature currents based on the mover position signal $\theta$ detected by the position detector 13 formed by a linear sensor.

The current detector 9 detects currents $i_a$ and $i_b$ for two phases flowing through the armature windings of the three-phase linear motor M to compute an armature current $i_c$ based on the armature currents $i_a$ and $i_b$.

The coordinate converter 11 includes a three-phase/two-phase conversion section 33 and an orthogonal two-axis conversion section 35. The three-phase/two-phase conversion section 33 performs a three-phase/two-phase conversion on the armature currents $i_a$, $i_b$, and $i_c$ into an $\alpha$-axis current command $i_\alpha$ and a $\beta$-axis current command $i_\beta$. Specifically, the conversion is performed using formulas $i_\alpha = \sqrt{(3/2)} \times i_a$ and $i_\beta = (1/\sqrt{2}) \times i_b - (1/\sqrt{2}) \times i_c = (1/\sqrt{2}) \times i_a + \sqrt{2} \times i_b$. The orthogonal two-axis conversion section 35 performs an orthogonal two-axis conversion on the $\alpha$-axis current command $i_\alpha$ and the $\beta$-axis current command $i_\beta$ into a d-axis current feedback signal $i_d$ and a q-axis current feedback signal $i_q$ based on a signal corresponding to the mover position (θ) from the position detector 13.

The position detector 13, which is formed by a linear sensor, detects the mover position of the mover with respect to the stator to output a detected mover position signal θ indicating the mover position. The feedback speed signal generating section 15 generates a feedback speed signal Vc, which indicates the speed of the mover of the three-phase linear motor M, based on the detected mover position signal θ.

The deterioration determining system 17 determines whether or not the plurality of permanent magnets 19 provided at the stator of the three-phase linear motor M have been deteriorated based on the α-axis current command $i_\alpha$ and the β-axis current command $i_\beta$ output from the three-phase/two-phase conversion section 33. If the permanent magnets 19 of the three-phase linear motor M have been deteriorated, the armature current is increased to supplement the shortage of the magnetic flux of the permanent magnets 19. Therefore, only the locus of a current vector for a deteriorated portion of the permanent magnets exceeds a standard upper limit value. The deterioration determining system 17 detects deterioration of the permanent magnets 19 based on such a phenomenon. The term "deterioration" of the permanent magnets refers to a reduction in magnetic force of the permanent magnets caused by breakage, chipping, demagnetization, or the like of the permanent magnets. When deterioration is detected, an alarm generating section 41 to be discussed later outputs an alarm signal AS. The alarm signal AS may be used in any way. For example, the alarm signal AS may be used to issue a warning, or to interrupt an operation of a power converter to stop supply of power to the motor. If the gap between the mover and the stator is narrowed for some reason, the magnetic flux of the permanent magnets 19 is increased (the permanent magnets 19 are magnetized), thereby reducing the armature current, in contrast to when the permanent magnets 19 are deteriorated. This phenomenon does not indicate deterioration of the permanent magnets 19, and therefore is not detected in the embodiment.

Figure 2:
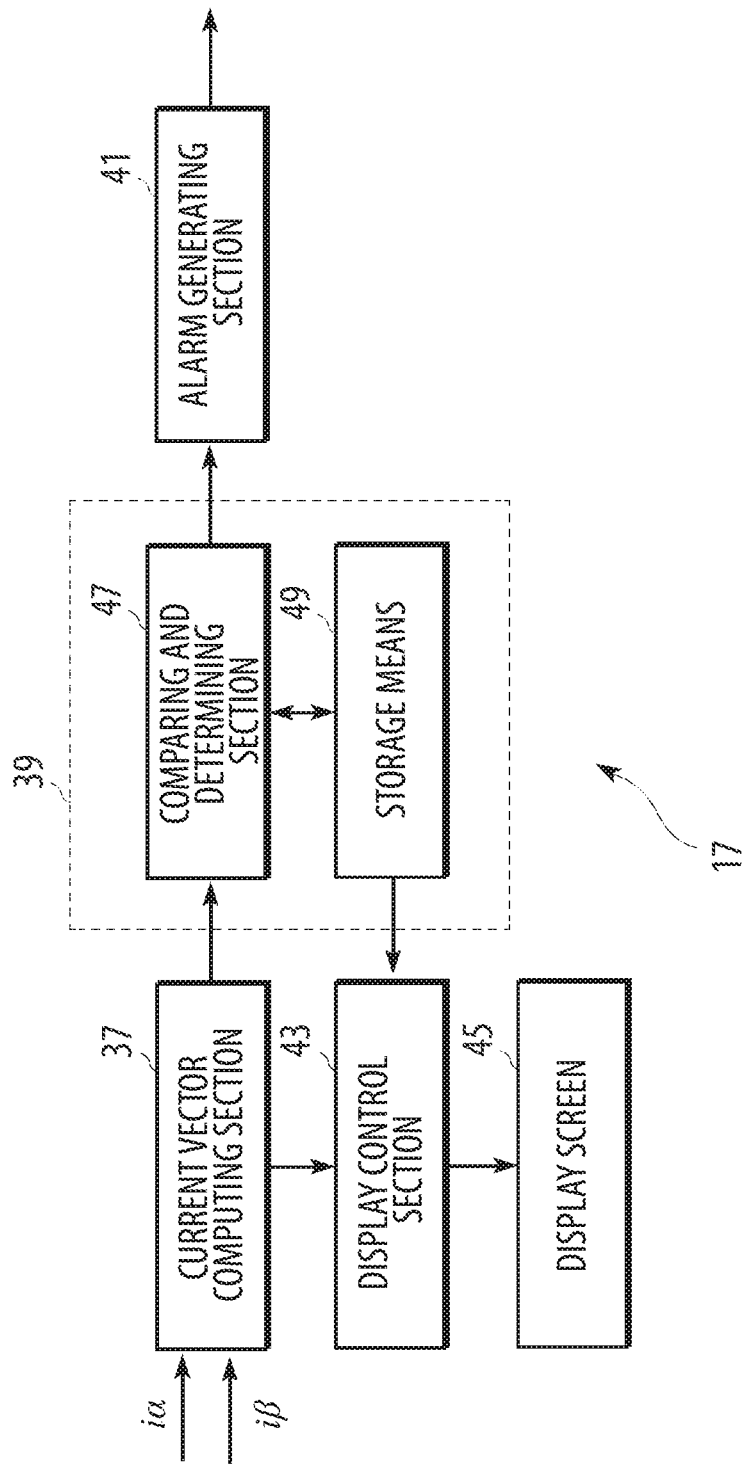
FIG. 2 shows an exemplary specific configuration of the deterioration determining system according to the first embodiment of the present invention.
Figure 3:
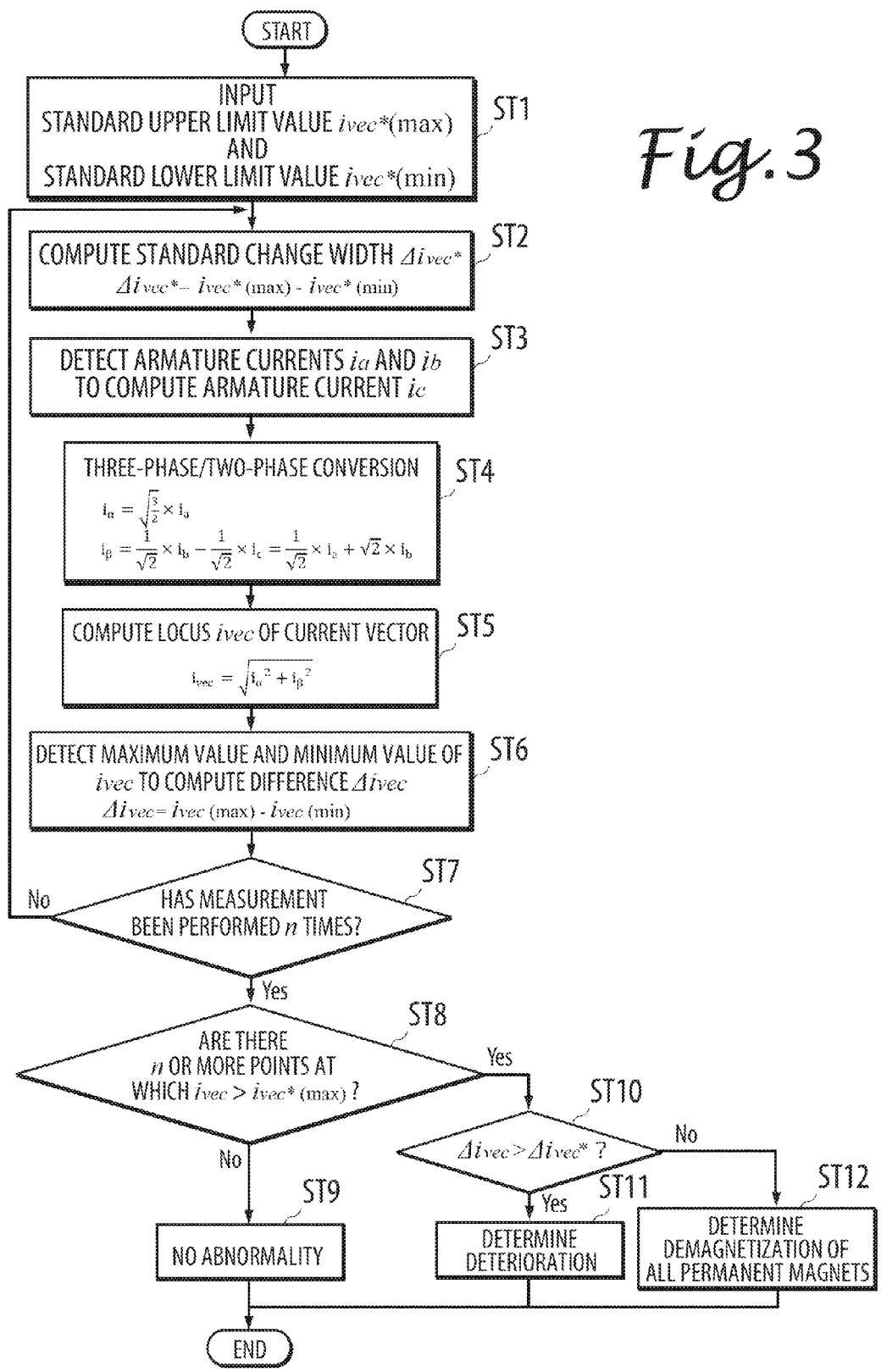
FIG. 3 is a flowchart showing steps performed by the deterioration determining system according to the present invention to determine whether or not the permanent magnets are deteriorated.

FIG. 2 shows an exemplary embodiment of the deterioration determining system 17. FIG. 3 is a flowchart showing steps performed by the deterioration determining system 17 to determine whether or not the permanent magnets 19 are deteriorated.

As shown in FIG. 2, the deterioration determining system 17 includes a current vector computing section 37, a deterioration state determining section 39, an alarm generating section 41, a display control section 43, and a display screen 45. In the embodiment, although not shown in FIG. 2, the deterioration determining system 17 also includes the current detector 9 and the three-phase/two-phase conversion section 33, which are configured to obtain the α-axis current command $i_\alpha$ and the β-axis current command $i_\beta$. The current vector computing section 37 computes a current vector based on the α-axis current command $i_\alpha$ and the β-axis current command $i_\beta$ at a predetermined sampling period. A collection of the computed results form a locus $i_{vec}$ of the current vector. The current vector computing section 37 outputs the locus $i_{vec}$ of the current vector to a comparing and determining section 47 of the deterioration state determining section 39. In order to appropriately detect not only general deterioration but also local deterioration of the permanent magnets 19, the sampling period is set to 0.2 seconds. The comparing and determining section 47 compares the locus $i_{vec}$ of the current vector and a standard upper limit value $i_{vec*(max)}$ to be discussed later stored in a storage means 49. The comparing and determining section 47 determines whether or not at least part of the plurality of permanent magnets 19 has been deteriorated based on the number of times that the locus $i_{vec}$ of the current vector exceeds the standard upper limit value $i_{vec*(max)}$. If the comparing and determining section 47 determines that the permanent magnets 19 have been deteriorated, the comparing and determining section 47 outputs a deterioration detection signal to the alarm generating section 41. Upon receiving the deterioration detection signal, the alarm generating section 41 generates an alarm signal AS indicating that the permanent magnets 19 have been deteriorated. The storage means 49 also stores a standard lower limit value $i_{vec*(min)}$ and a standard change width $\Delta i_{vec*}$ computed based on the difference between the standard upper limit value $i_{vec*(max)}$ and the standard lower limit value $i_{vec*(min)}$. The current vector computing section 37 computes a change width $\Delta i_{vec}$ of the locus $i_{vec}$ of the current vector from the maximum value and the minimum value of the locus $i_{vec}$ of the current vector. The comparing and determining section 47 has a function of determining whether or not $\Delta i_{vec}$ exceeds $\Delta i_{vec*}$ and a function of determining demagnetization of all permanent magnets.

The display control section 43 displays an image on the display screen 45 based on the locus $i_{vec}$ of the current vector computed by the current vector computing section 37 and the standard upper limit value $i_{vec*(max)}$ and the standard lower limit value $i_{vec*(min)}$ stored in the storage means 49. The display control section 43 and the display screen 45 are not essential components. The deterioration determining system 17 according to the embodiment includes these constituent elements to allow visual examination of the locus of the current vector.

The storage means 49 stores the standard upper limit value $i_{vec*(max)}$ and the standard lower limit value $i_{vec*(min)}$. In the embodiment, the standard upper limit value $i_{vec*(max)}$ and the standard lower limit value $i_{vec*(min)}$ are obtained by providing a normal three-phase linear motor including a plurality of undeteriorated permanent magnets and armature windings, and computing a locus $i_{vec}$ of a current vector of an armature current obtained by flowing the armature current to the armature windings of the three-phase linear motor to define an average value of a maximum value and an average value of a minimum value of the width of changes in the computed locus as the standard upper limit value $i_{vec*(max)}$ and the standard lower limit value $i_{vec*(min)}$, respectively. The armature currents for the normal three-phase linear motor are balanced three-phase currents. Thus, when a three-phase/two-phase conversion is performed on the three-phase armature currents to compute α- and β-axis currents with a phase difference of 90°, a current vector computed based on the α- and β-axis currents has a constant magnitude, and changes only in direction. Thus, the locus of the current vector has an annular, substantially circular shape. In the embodiment, the mover of the normal electric apparatus is moved a plurality of cycles with respect to the stator to measure the locus of the current vector of the armature current a plurality of times, and the standard upper limit value $i_{vec*(max)}$ and the standard lower limit value $i_{vec*(min)}$ are defined based on the width of changes in the radius of the measured locus of the current vector. Then, in the embodiment, as discussed later, the number of points at which the locus $i_{vec}$ of the current vector for the α-axis current command $i_\alpha$ and the β-axis current command $i_\beta$ exceeds the standard upper limit value $i_{vec*(max)}$ is counted to determine whether or not the permanent magnets 19 of the three-phase linear motor M have been deteriorated. The α-axis current command $i_\alpha$ and the β-axis current command $i_\beta$ are obtained through the three-phase/two-phase conversion performed on the armature currents for the three-phase linear motor M to be inspected. The above method of determining the standard upper limit value $i_{vec*(max)}$ and the standard lower limit value $i_{vec*(min)}$ is exemplary. Other methods of defining the standard upper limit value $i_{vec*(max)}$ and the standard lower limit value $i_{vec*(min)}$ include computing (through simulation) a locus of a current vector of an armature current obtained by flowing a rated current to the armature winding of the normal electric apparatus under a rated load to define the standard upper limit value $i_{vec*(max)}$ and the standard lower limit value $i_{vec*(min)}$ based on the computed locus. In this case, the standard upper limit value $i_{vec*(max)}$ may be a value that is equal to or less than the locus of the current vector computed based on the rated current value multiplied by 1.1, for example, and the standard lower limit value $i_{vec*(min)}$ may be a value that is equal to or more than the locus of the current vector computed based on the rated current value multiplied by 0.9, for example.

Steps for inspecting the permanent magnets 19 according to the embodiment will be described with reference to FIG. 3. Prior to the inspection, the load on the electric apparatus to be inspected is replaced with a load L that was used to acquire the standard upper limit value $i_{vec*(max)}$ and the standard lower limit value $i_{vec*(min)}$, if necessary, in order to place the electric apparatus to be inspected under the same measurement conditions as those of the electric apparatus for comparison (if the standard upper limit value $i_{vec*(max)}$ and the standard lower limit value $i_{vec*(min)}$ were defined with a rated current value, for example, the load on the electric apparatus to be inspected is replaced with a rated load).

First, a standard upper limit value $i_{vec*(max)}$ and a standard lower limit value $i_{vec*(min)}$ are input using an input means (not shown), and stored in the storage means 49 (step ST1). The standard upper limit value $i_{vec*(max)}$ and the standard lower limit value $i_{vec*(min)}$ may be measured in advance to be stored in the storage means 49 each time the electric apparatus to be inspected is changed. Alternatively, the standard upper limit value $i_{vec*max)}$ and the standard lower limit value $i_{vec*(min)}$ may be defined in advance to be stored in the storage means 49 for all the electric apparatuses that are planned to be measured, and the standard upper limit value $i_{vec*(max)}$ and the standard lower limit value $i_{vec*(min)}$ to be used may be selected at the time of measurement. A standard change width $\Delta i_{vec*}$ computed in advance based on the input or selected standard upper limit value $i_{vec*(max)}$ and standard lower limit value $i_{vec*(min)}$ is stored in the storage means 49 (step ST2). The standard change width $\Delta i_{vec*}$ is computed using a formula $\Delta i_{vec*} = i_{vec*(max)} - i_{vec*(min)}$. Next, the current detector 9 detects armature currents $i_a$ and $i_b$ flowing through the armature windings for two phases of the three-phase linear motor M to compute an armature current $i_c$ based on the armature currents $i_a$ and $i_b$ (step ST3). Then, the three-phase/two-phase conversion section 33 converts the armature currents $i_a$, $i_b$, and $i_c$ into an α-axis current command $i_\alpha$ and a β-axis current command $i_\beta$ (step ST4). The current vector computing section 37 computes the locus of the current vector $i_{vec} = \sqrt{(i_\alpha^2 + i_\beta^2)}$ (step ST5). The current vector computing section 37 further detects a maximum value and a minimum value of $i_{vec}$ during the measurement period for each sampling to compute a difference $\Delta i_{vec}$ between the maximum value and the minimum value (step ST6). Steps ST3 to ST6 are repeated for each sampling.

In the embodiment, the current vector computing section 37 is configured to compute one annular locus $i_{vec}$ of the current vector as the mover of the three-phase linear motor M moves over each of the permanent magnets 19 provided at the stator. Then, when the mover is moved n cycles with respect to the stator, the locus $i_{vec}$ of the current vector is computed n times for all of the plurality of permanent magnets 19 (step ST7). The locus $i_{vec}$ of the current vector is computed n times to prevent erroneous determination due to noise. If the permanent magnets have been deteriorated, the armature current is inevitably increased when the mover passes over the deteriorated portion. Therefore, measuring the locus $i_{vec}$ of the current vector n times should result in the locus $i_{vec}$ of the current vector exceeding the standard upper limit value $i_{vec*(max)}$ n times. If the current is increased less than n times in this case, presence of noise is determined. If the current is increased n times or more, it is determined that the permanent magnets have been deteriorated, although with some noise. This makes it possible to improve the measurement accuracy by eliminating the effect of noise. In the embodiment, after the measurement is performed n times, the comparing and determining section 47 determines whether or not there are n or more points at which the locus $i_{vec}$ of the current vector exceeds the standard upper limit value $i_{vec*(max)}$ (Step ST8). If there are less than n points at which the locus $i_{vec}$ of the current vector exceeds the standard upper limit value $i_{vec*(max)}$, it is considered that such points are caused by the effect of noise or the like, and it is determined that there is no abnormality (step ST9). If there are n or more points at which the locus $i_{vec}$ of the current vector exceeds the standard upper limit value $i_{vec*(max)}$, can be considered that at least part of the plurality of permanent magnets 19 has been deteriorated. The alarm generating section 41 may be configured to issue an alarm signal AS at this time. In the embodiment, however, the comparing and determining section 49 further determines whether or not the difference $\Delta i_{vec}$ for the three-phase linear motor M to be inspected exceeds the standard change width $\Delta i_{vec*}$ (step ST10). If $\Delta i_{vec}$ does not exceed the standard change width $\Delta i_{vec*}$, there is no possibility that the permanent magnets 19 have been broken, chipped, or locally demagnetized, and it is determined that the permanent magnets 19 have been totally demagnetized. Demagnetization of all permanent magnets does not immediately affect an operation of the three-phase linear motor M. Therefore, an alarm issued in this case indicates that the electric apparatus should be repaired or replaced in the near future. Thus, if $\Delta i_{vec}$ exceeds the standard change width $\Delta i_{vec*}$, it is determined that the permanent magnets 19 have been deteriorated (step ST11). If $\Delta i_{vec}$ does not exceed the standard change width $\Delta i_{vec*}$, it is determined that all of the permanent magnets 19 have been demagnetized (step ST12).

Figure 4:
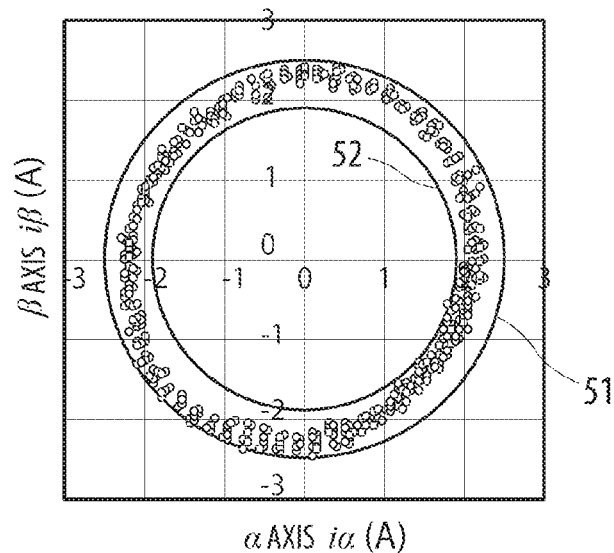
FIG. 4 shows an exemplary waveform to be displayed on a display screen when the permanent magnets are not deteriorated.
Figure 5:
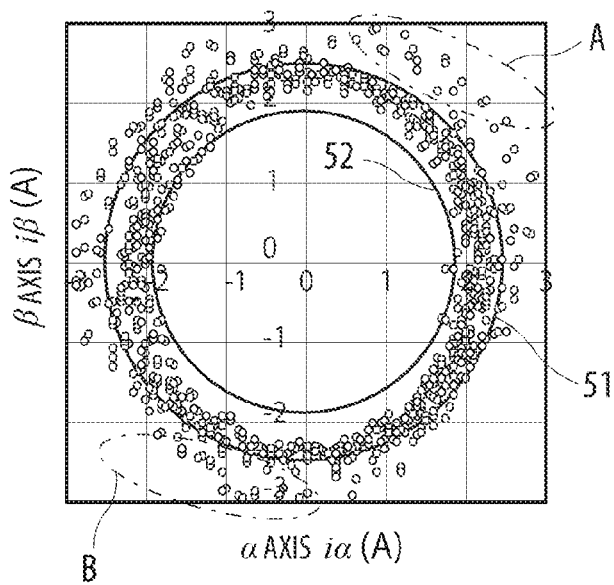
FIG. 5 shows an exemplary waveform to be displayed on the display screen when the permanent magnets are significantly chipped.
Figure 6:
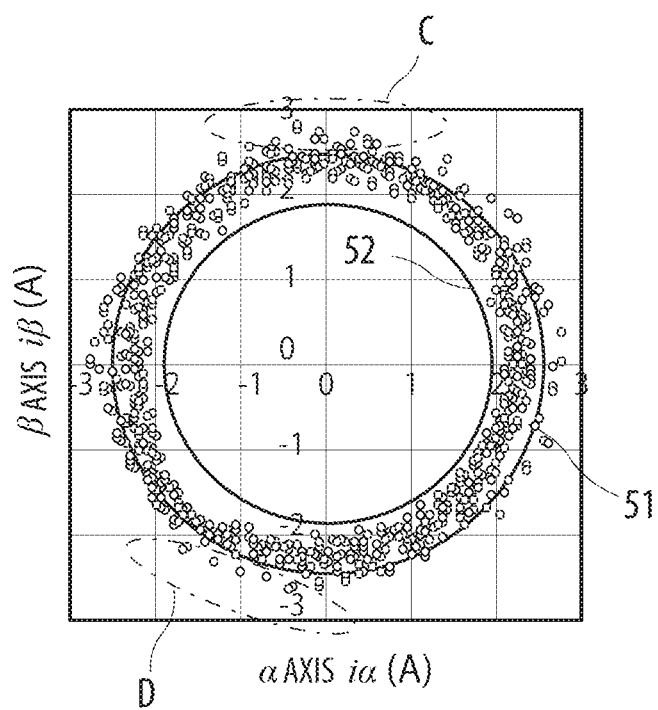
FIG. 6 shows an exemplary waveform to be displayed on the display screen when the permanent magnets are slightly chipped.

FIGS. 4 to 6 each show an exemplary waveform to be displayed on the display screen 45. The horizontal axis represents the α-axis current $i_\alpha$. The vertical axis represents the β-axis current $i_\beta$. The intersection (origin 0) of the α- and β-axes is set to the center of the screen. The display screen 45 displays an annular image 51 corresponding to the standard upper limit value $i_{vec*(max)}$ and an annular image 52 corresponding to the standard lower limit value $i_{vec*min)}$. The locus $i_{vec}$ of the current vector of the three-phase linear motor M to be inspected is plotted so as to be superimposed on the annular images 51 and 52. FIG. 4 shows an example in which it is determined that there is no abnormality. FIGS. 5 and 6 each show an example in which it is determined that the permanent magnets 19 are deteriorated.

FIG. 4 shows an example in which the permanent magnets 19 have not been deteriorated. It is found that every locus $i_{vec}$ of the current vector is provided between the annular images 51 and 52. In contrast, FIG. 5 shows an example in which part of the permanent magnets 19 is significantly broken. It is found that the locus $i_{vec}$ of the current vector significantly exceeds the standard upper limit value $i_{vec*(max)}$ over the entire circumference in regions indicated by symbol A and symbol B, for example. FIG. 6 shows an example in which part of the permanent magnets 19 is slightly broken. It is found that the locus $i_{vec}$ the current vector exceeds the standard upper limit value $i_{vec*(max)}$ in regions indicated by symbol C and symbol D. In FIGS. 5 and 6, $\Delta i_{vec}$ exceeds the standard change width $\Delta i_{vec*}$. Therefore, it is found that all of the permanent magnets 19 are not demagnetized.

Figure 7:
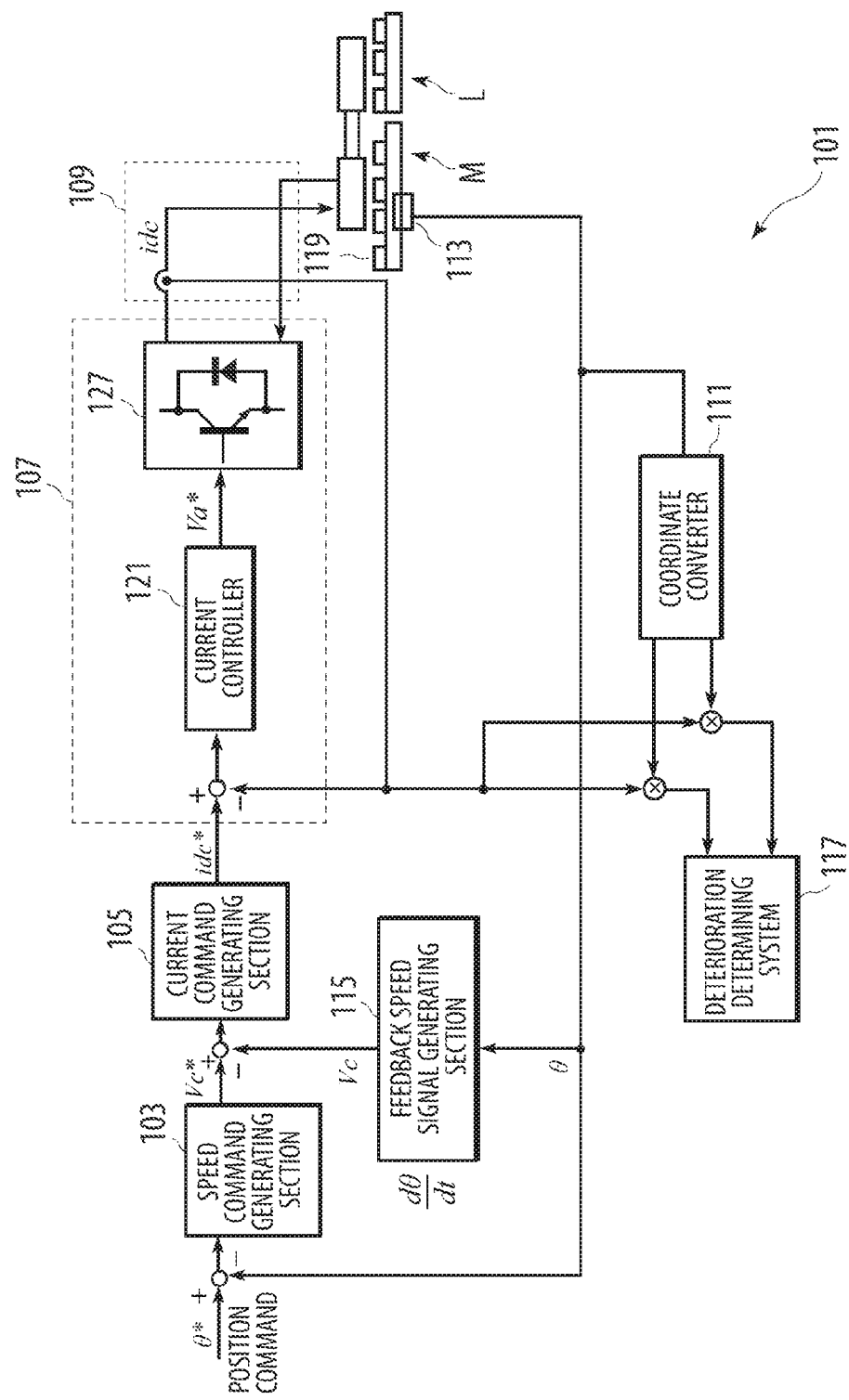
FIG. 7 is a system configuration diagram showing the configuration of a control device for a DC linear motor including a deterioration determining system for permanent magnets according to a second embodiment of the present invention.
Figure 8:
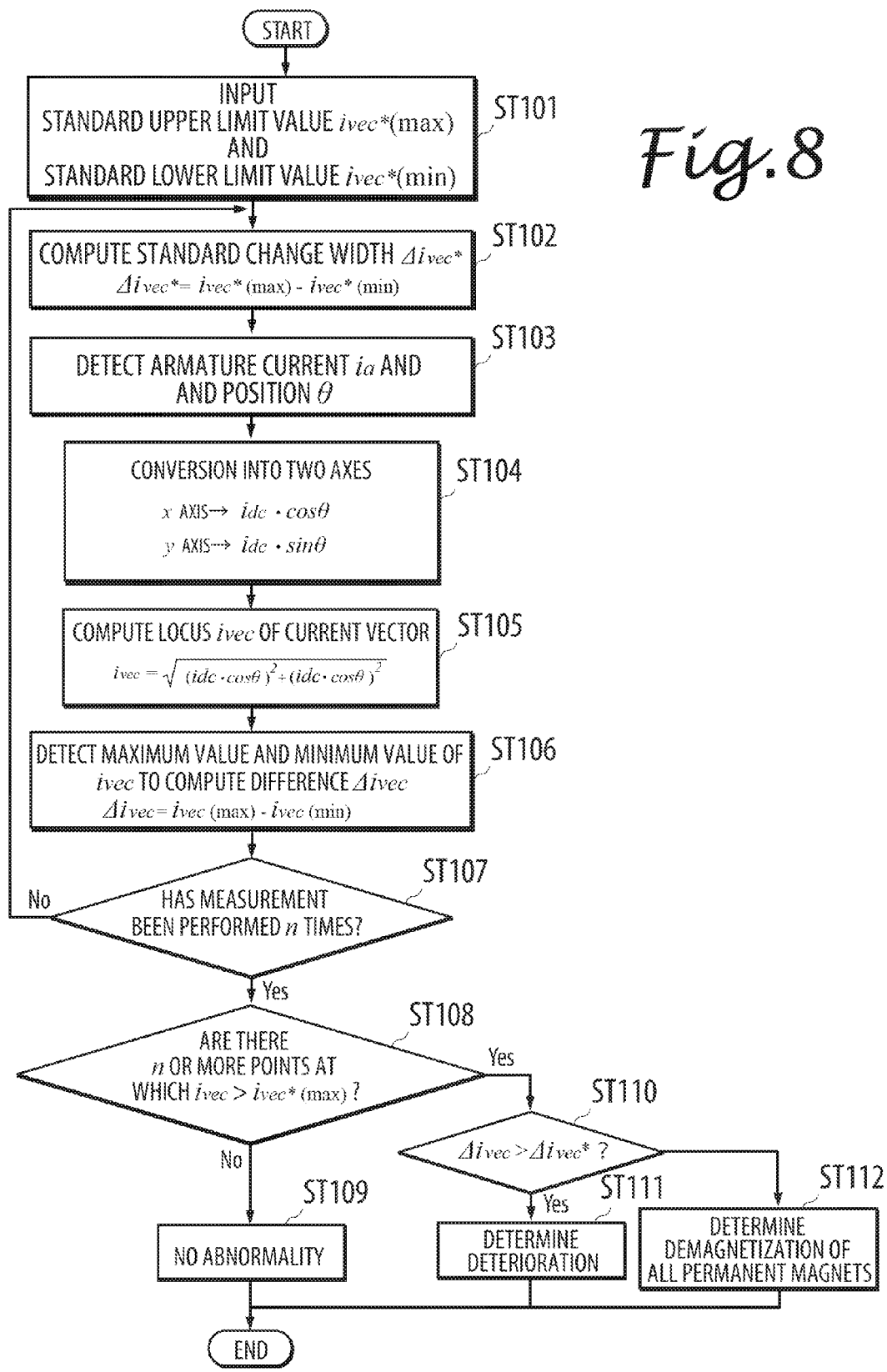
FIG. 8 is a flowchart showing steps performed by the deterioration determining system according to the second embodiment to determine whether or not the permanent magnets are deteriorated.

FIG. 7 is a system configuration diagram showing a second embodiment in which a DC linear motor is to be inspected. FIG. 8 is a flowchart showing steps performed when a deterioration determining system according to the second embodiment detects whether or not permanent magnets are deteriorated. A current detector 109 detects an armature current $i_{dc}$ (step ST103). A coordinate converter 111 converts the armature current $i_{dc}$ for a single phase into two-axis currents $i_{dc}\cos\theta$ and $i_{dc}\sin\theta$ based on a signal corresponding to the position ($\theta$) detected by a position detector 113 formed by a linear sensor (step ST104). The locus $i_{vec}$ of the current vector is computed as $i_{vec}=\sqrt{((i_{dc}\cdot\sin\theta)^2+(i_{dc}\cdot\cos\theta)^2)}$ (step ST105).

Other constituent elements and steps are similar to those of the control device 1 and steps shown in FIGS. 1 to 3, and therefore are denoted by reference numerals obtained by adding 100 to the reference numerals affixed to their counterparts in FIGS. 1 to 3 and descriptions thereof are omitted. This configuration allows application of the deterioration determination method and system to a DC linear motor. The present invention may also be applied to the determination of deterioration of permanent magnets of an n-phase electric motor or generator.

Figure 9:
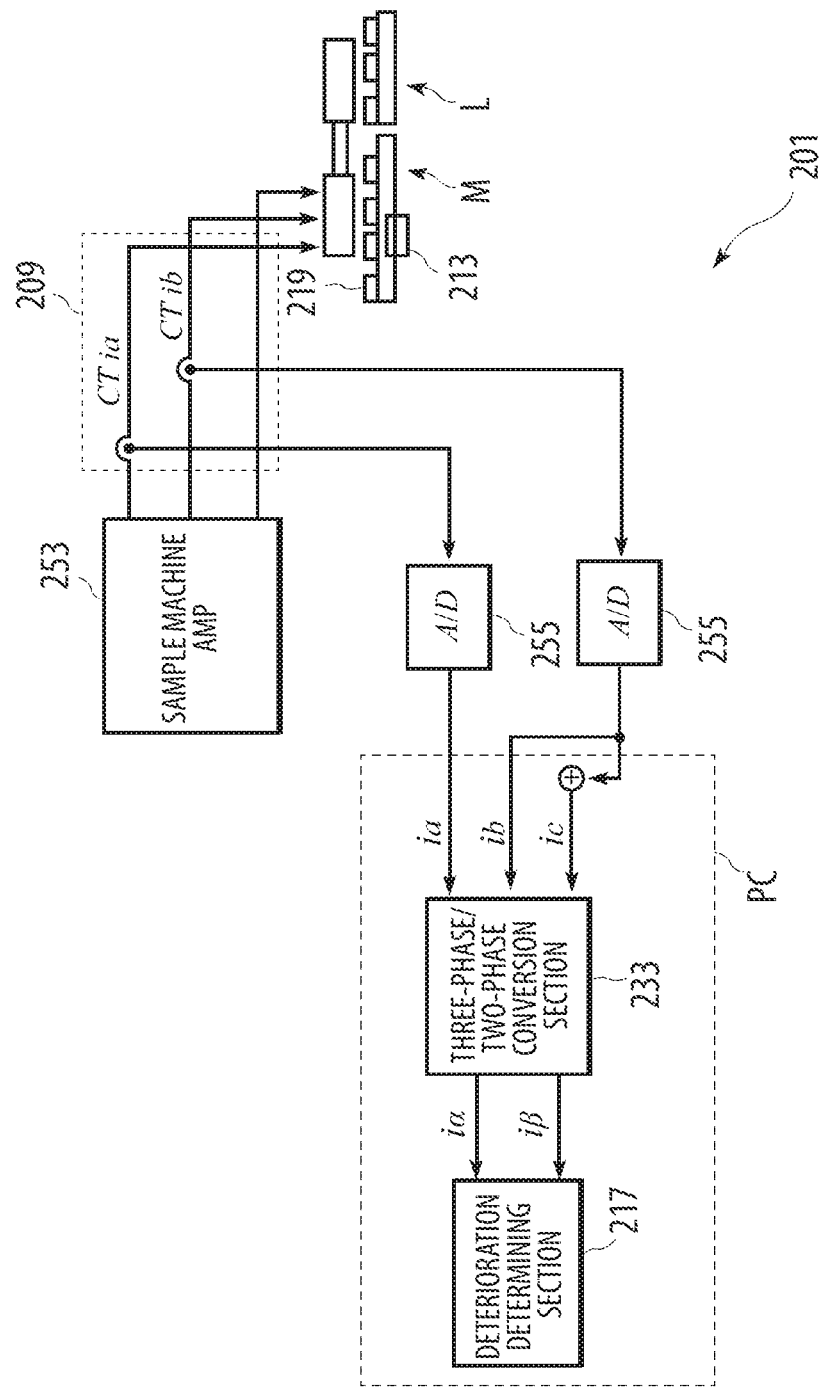
FIG. 9 shows a third embodiment in which deterioration of permanent magnets of a three-phase linear motor is determined using a computer.

FIG. 9 shows the configuration of a third embodiment of the present invention in which deterioration of permanent magnets of a three-phase linear motor is determined using a computer PC. In the embodiment, a current detector 209 is attached to power lines extending from a sample machine 253 and connected to a mover of a three-phase linear motor M to acquire current values for two phases. A/D conversion devices 255 are used to convert the current values for two phases into armature currents $i_a$, $i_b$, and $i_c$ for three phases to be input to the computer PC. In the computer PC, a three-phase/two-phase conversion section 233 performs a three-phase/two-phase conversion on the armature currents $i_a$, $i_b$, and $i_c$ to obtain an $\alpha$-axis current command $i_\alpha$ and a $\beta$-axis current command $i_\beta$, and a deterioration determining section 217 determines deterioration of permanent magnets in the same method as in the first embodiment. Other constituent elements and steps are similar to those of the control device 1 and steps shown in FIGS. 1 to 3, and therefore are denoted by reference numerals obtained by adding 200 to the reference numerals affixed to their counterparts in FIGS. 1 to 3 and descriptions thereof are omitted.

Figure 10:
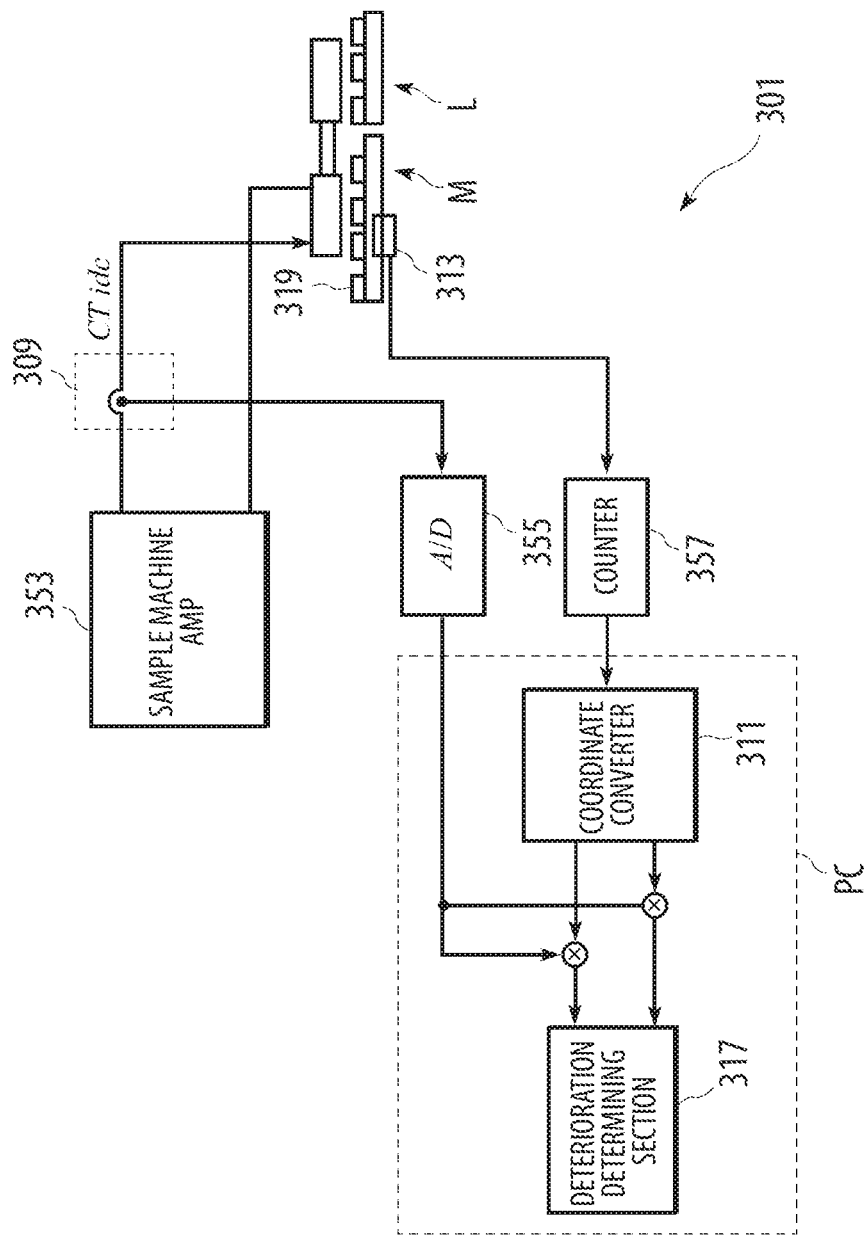
FIG. 10 shows a fourth embodiment in which deterioration of permanent magnets of a DC linear motor is determined using a computer.

FIG. 10 shows the configuration of a fourth embodiment of the present invention in which deterioration of permanent magnets of a DC linear motor is determined using a computer PC. In the embodiment, a current detector 309 is attached to power lines extending from a sample machine 353 and connected to a mover of a DC linear motor M to acquire a current value. The computer PC receives an output of an A/D conversion device 355 and an output of a counter 357 configured to operate according to a position ($\theta$) detected by a position detector 313 formed by a linear sensor. In the computer PC, a coordinate converter 311 computes $i_{dc}\cos\theta$ and $i_{dc}\sin\theta$ based on the input information, and a deterioration determining section 317 determines deterioration of permanent magnets in the same method as in the second embodiment. Other constituent elements and steps are similar to those of the control device 1 and steps shown in FIGS. 1 to 3, and therefore are denoted by reference numerals obtained by adding 300 to the reference numerals affixed to their counterparts in FIGS. 1 to 3 and descriptions thereof are omitted.

According to the configurations of the third and fourth embodiments, deterioration of permanent magnets can be determined, without adding a dedicated device, if armature currents can be detected.

The numerical values used herein are merely illustrative, and are not intended to be limiting. Such numerical values may be appropriately modified according to the electric apparatus to be inspected.

According to the present invention, it is possible to provide a method and a system for determining deterioration of permanent magnets of an electric apparatus to be inspected that facilitate determination without the need to remove the electric apparatus from a facility where it is installed.

What is claimed is:

1. A method of determining deterioration of permanent magnets of an electric apparatus to be inspected, the electric apparatus to be inspected including a mover, a stator, a plurality of permanent magnets provided at one of the mover and the stator, and an armature winding provided at the other of the mover and the stator, the method comprising:
    computing a locus of a current vector of an armature current that flows through the armature winding; and
    determining a state of deterioration of the permanent magnets based on changes in the locus of the current vector.

2. The method of determining deterioration of permanent magnets according to claim 1, further comprising:
    providing a normal electric apparatus including a mover, a stator, a plurality of undeteriorated permanent magnets provided at one of the mover and the stator, and an armature winding provided at the other of the mover and the stator;
    computing a locus of a current vector of an armature current that flows through the armature winding of the normal electric apparatus to define a standard upper limit value based on a width of changes in the locus for the normal electric apparatus; and
    determining that at least part of the permanent magnets of the electric apparatus to be inspected has been deteriorated if the locus of the current vector of the electric apparatus to be inspected exceeds the standard upper limit value.

3. The method of determining deterioration of permanent magnets according to claim 2, further comprising:
    defining a standard lower limit value based on the width of changes in the locus for the normal electric apparatus, and defining a difference between the standard upper limit value and the standard lower limit value as a standard change width; and
    computing a difference between a maximum value and a minimum value of the locus of the current vector of the electric apparatus to be inspected, and determining that all of the plurality of permanent magnets of the electric apparatus to be inspected have been demagnetized if the difference between the maximum value and the minimum value does not exceed the standard change width.

4. The method of determining deterioration of permanent magnets according to claim 3, further comprising:
    displaying an annular image corresponding to the standard upper limit value and the standard lower limit value on a display screen; and
    displaying the locus of the current vector of the armature current that flows through the armature winding of the electric apparatus to be inspected on the display screen to superimpose the locus on the annular image.

5. The method of determining deterioration of permanent magnets according to claim 1, further comprising:

providing a normal electric apparatus including a mover, a stator, a plurality of undeteriorated permanent magnets provided at one of the mover and the stator, and an armature winding provided at the other of the mover and the stator;

computing a locus of a current vector of an armature current obtained by flowing a rated current to the armature winding of the normal electric apparatus under a rated load to define a standard upper limit value based on the locus of the current vector of the normal electric apparatus; and computing a locus of a current vector of an armature current obtained by flowing the rated current to the armature winding of the electric apparatus to be inspected under the rated load to determine that at least part of the permanent magnets of the electric apparatus to be inspected has been deteriorated if the locus of the current vector of the electric apparatus to be inspected exceeds the standard upper limit value.

6. The method of determining deterioration of permanent magnets according to claim 5, further comprising:

defining a standard lower limit value based on the locus for the normal electric apparatus, and defining a difference between the standard upper limit value and the standard lower limit value as a standard change width; and computing a difference between a maximum value and a minimum value of the locus of the current vector of the electric apparatus to be inspected, and determining that all of the plurality of permanent magnets of the electric apparatus to be inspected have been demagnetized if the difference between the maximum value and the minimum value does not exceed the standard change width.

7. The method of determining deterioration of permanent magnets according to claim 6, further comprising:

displaying an annular image corresponding to the standard upper limit value and the standard lower limit value on a display screen; and displaying the locus of the current vector of the armature current that flows through the armature winding of the electric apparatus to be inspected on the display screen to superimpose the locus on the annular image.

8. A deterioration determining system for permanent magnets configured to determine a state of deterioration of a plurality of permanent magnets of an electric apparatus to be inspected, the electric apparatus to be inspected including a mover, a stator, the permanent magnets provided at one of the mover and the stator, and an armature winding provided at the other of the mover and the stator, the deterioration determining system for permanent magnets comprising:

a current detecting section configured to detect an armature current that flows through the armature winding;

a current vector computing section configured to compute a locus of a current vector based on the armature current; and a deterioration state determining section configured to determine the state of deterioration of the permanent magnets based on changes in the locus of the current vector.

9. The deterioration determining system for permanent magnets according to claim 8, wherein the deterioration state determining section comprises:

a storage means for storing a standard upper limit value defined by providing a normal electric apparatus including a mover, a stator, a plurality of undeteriorated permanent magnets provided at one of the mover and the stator, and an armature winding provided at the other of the mover and the stator, and computing a locus of a current vector of an armature current that flows through the armature winding of the normal electric apparatus to define the standard upper limit value based on a width of changes in the locus for the normal electric apparatus; and a comparing and determining section configured to compare the locus of the current vector of the electric apparatus to be inspected and the standard upper limit value and determine whether or not at least part of the plurality of permanent magnets of the electric apparatus to be inspected has been deteriorated based on the number of times that the locus of the current vector of the electric apparatus to be inspected exceeds the standard upper limit value.

10. The deterioration determining system for permanent magnets according to claim 9, wherein:

the storage means of the deterioration state determining section further stores as a standard change width a difference between a standard lower limit value defined based on the width of changes in the locus for the normal electric apparatus and the standard upper limit value; and the comparing and determining section determines that all of the plurality of permanent magnets of the electric apparatus to be inspected have been demagnetized if a difference between a maximum value and a minimum value of the locus of the current vector of the electric apparatus to be inspected does not exceed the standard change width.

11. The deterioration determining system for permanent magnets according to claim 10, wherein:

the current vector computing section is configured to compute one annular locus of the current vector for each of the permanent magnets;

the current vector computing section computes the current vector n times for all of the plurality of permanent magnets, the n being a natural number; and the comparing and determining section determines that the deterioration has occurred if the locus of each of the n current vectors for all of the plurality of permanent magnets exceeds the standard upper limit value n times or more.

12. An electric apparatus comprising the deterioration determining system for permanent magnets according to claim 10.

13. The deterioration determining system for permanent magnets according to claim 9, wherein:

the current vector computing section is configured to compute one annular locus of the current vector for each of the permanent magnets;

the current vector computing section computes the current vector n times for all of the plurality of permanent magnets, the n being a natural number; and the comparing and determining section determines that the deterioration has occurred if the locus of each of the n current vectors for all of the plurality of permanent magnets exceeds the standard upper limit value n times or more.

14. An electric apparatus comprising the deterioration determining system for permanent magnets according to claim 9.

15. The deterioration determining system for permanent magnets according to claim 8, wherein the deterioration state determining section comprises:

a storage means for storing a standard upper limit value defined by providing a normal electric apparatus including a mover, a stator, a plurality of undeteriorated permanent magnets provided at one of the mover and the stator, and an armature winding provided at the other of the mover and the stator, and computing a locus of a current vector of an armature current obtained by flowing a rated current to the armature winding of the normal electric apparatus under a rated load to define the standard upper limit value based on the locus of the current vector of the normal electric apparatus; and a comparing and determining section configured to compare a locus of a current vector of an armature current obtained by flowing the rated current to the armature winding of the electric apparatus to be inspected under the rated load and the standard upper limit value and to determine whether or not at least part of the plurality of permanent magnets of the electric apparatus to be inspected has been deteriorated based on the number of times that the locus of the current vector of the electric apparatus to be inspected exceeds the standard upper limit value.

16. The deterioration determining system for permanent magnets according to claim 15, wherein:

the storage means of the deterioration state determining section further stores as a standard change width a difference between a standard lower limit value defined based on the locus for the normal electric apparatus and the standard upper limit value thereof; and the comparing and determining section determines that all of the plurality of permanent magnets of the electric apparatus to be inspected have been demagnetized if a difference between a maximum value and a minimum value of the locus of the current vector of the electric apparatus to be inspected does not exceed the standard change width.

17. The deterioration determining system for permanent magnets according to claim 16, wherein:

the current vector computing section is configured to compute one annular locus of the current vector for each of the permanent magnets;

the current vector computing section computes the current vector n times for all of the plurality of permanent magnets, the n being a natural number; and the comparing and determining section determines that the deterioration has occurred if the locus of each of the n current vectors for all of the plurality of permanent magnets exceeds the standard upper limit value n times or more.

18. The deterioration determining system for permanent magnets according to claim 15, wherein:

the current vector computing section is configured to compute one annular locus of the current vector for each of the permanent magnets;

the current vector computing section computes the current vector n times for all of the plurality of permanent magnets, the n being a natural number; and the comparing and determining section determines that the deterioration has occurred if the locus of each of the n current vectors for all of the plurality of permanent magnets exceeds the standard upper limit value n times or more.

19. An electric apparatus comprising the deterioration determining system for permanent magnets according to claim 15.

20. An electric apparatus comprising the deterioration determining system for permanent magnets according to claim 8.

* * * * *